US011575359B2

(12) United States Patent
Bhat et al.

(10) Patent No.: US 11,575,359 B2
(45) Date of Patent: Feb. 7, 2023

(54) MULTI-PORT COUPLED INDUCTOR WITH INTERFERENCE SUPPRESSION

(71) Applicant: Cisco Technology, Inc., San Jose, CA (US)

(72) Inventors: Abhishek Bhat, Breinigsville, PA (US); Romesh Kumar Nandwana, Breinigsville, PA (US); Kadaba Lakshmikumar, Basking Ridge, NJ (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 17/302,001

(22) Filed: Apr. 21, 2021

(65) Prior Publication Data
US 2022/0345102 A1 Oct. 27, 2022

(51) Int. Cl.
*H03H 7/06* (2006.01)
*H03H 7/01* (2006.01)
*H03H 7/09* (2006.01)

(52) U.S. Cl.
CPC ............ *H03H 7/06* (2013.01); *H03H 7/0153* (2013.01); *H03H 7/09* (2013.01)

(58) Field of Classification Search
CPC ............ H03H 7/06; H03H 2001/0085; H03H 7/0153; H03H 7/09
USPC .................................................. 333/172, 185
See application file for complete search history.

(56) References Cited

U.S. PATENT DOCUMENTS

| 2004/0178857 | A1 | 9/2004 | Jacobsson et al. |
| 2010/0271086 | A1 | 10/2010 | Bao et al. |
| 2012/0313729 | A1* | 12/2012 | Togashi ................. H03H 7/425 333/24 R |
| 2013/0099870 | A1 | 4/2013 | Terrovitis |
| 2013/0239083 | A1* | 9/2013 | Ueno ..................... G06F 30/398 716/136 |
| 2014/0070898 | A1 | 3/2014 | Shirinfar et al. |
| 2015/0162888 | A1* | 6/2015 | Yunoki ................ H03H 7/0161 333/174 |

FOREIGN PATENT DOCUMENTS

WO  2020132963 A1  7/2020

OTHER PUBLICATIONS

N. M. Neihart, D. J. Allstot, M. Miller, and P. Rakers, "Twisted inductors for low coupling mixed-signal and RF applications," 2008 IEEE Custom Integrated Circuits Conference, Sep. 2008, pp. 575-578.

(Continued)

*Primary Examiner* — Rakesh B Patel
(74) *Attorney, Agent, or Firm* — Patterson + Sheridan, LLP

(57) ABSTRACT

A multi-port coupled inductor with interference suppression is provided with a first signal port connected to a first resistor port via a first inductor; a second resistor port connected to the first resistor port via a second inductor; a second signal port connected to the second resistor port via a third inductor; a third resistor port connected to the first resistor port via a first resistor; a fourth resistor port connected to the third resistor port via a fourth inductor and to the second resistor port via a second resistor; a third signal port connected to the third resistor port via a fifth inductor; and a fourth signal port connected to the fourth resistor port via a sixth inductor.

17 Claims, 8 Drawing Sheets

(56) References Cited

OTHER PUBLICATIONS

S. A.-R. Ahmadi-Mehr, M. Tohidian, and R. B. Staszewski, "Analysis and Design of a Multi-Core Oscillator for Ultra-Low Phase Noise," IEEE Transactions on Circuits and Systems I: Regular Papers, vol. 63, No. 4, pp. 529-539, Apr. 2016.
F. Padovan, F. Quadrelli, M. Bassi, M. Tiebout, and A. Bevilacqua, "A quad-core 15GHz BiCMOS VCO with ?124dBc/Hz phase noise at 1MHz offset, ?189dBc/Hz FOM, and robust to multimode concurrent oscillations," in 2018 IEEE International Solid—State Circuits Conference—(ISSCC), Feb. 2018, pp. 376-378.
U.S. Appl. No. 17/031,462 for CISC/CPOL1027573US01 filed Sep. 24, 2020.

* cited by examiner

MULTI-PORT COUPLED INDUCTOR WITH INTERFERENCE SUPPRESSION

TECHNICAL FIELD

Embodiments presented in this disclosure generally relate to a multi-port coupled inductor structure. More specifically, embodiments disclosed herein provide inductive/capacitive devices with improved interference suppression.

BACKGROUND

As users continue to demand higher data rates (both in wired and wireless applications) and smaller form factors for electronic devices, the elements of clocking circuits are faced with the dual challenge of being placed in closer proximity with one another, and generating greater amounts of interference between elements. For example, in a phase lock loop (PLL), various inductive/capacitive (LC) oscillators are used to generate a clock signal, but can cause interference in one another (resulting in jitter in the clock signal) if placed close enough to one another to induce coupling between the inductors. Designers can mitigate the risk of cross coupling by reducing the speed/power of the clock signal, increasing the distance between LC elements, or combinations thereof, which reduces the chances for electromagnetic coupling between neighboring inductors, albeit at the expense of data rate or device size.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

One embodiment presented in this disclosure is a device, comprising: a first signal port connected to a first resistor port via a first inductor; a second resistor port connected to the first resistor port via a second inductor; a second signal port connected to the second resistor port via a third inductor; a third resistor port connected to the first resistor port via a first resistor; a fourth resistor port connected to the third resistor port via a fourth inductor and to the second resistor port via a second resistor; a third signal port connected to the third resistor port via a fifth inductor; and a fourth signal port connected to the fourth resistor port via a sixth inductor.

One embodiment presented in this disclosure is a device, comprising: a first inductive loop connected to a second inductive loop by a first resistor and a second resistor, wherein each of the first inductive loop and the second inductive loop comprise: a first signal port connected to the first resistor via a first inductor; a second signal port connected to the second resistor via a second inductor; and a third inductor connected on a first side to the first inductor and the first resistor and connected on a second side to the second inductor and the second resistor.

One embodiment presented in this disclosure is a device, comprising: a first inductive loop configured to carry a first current that produces a first magnetic field, wherein the first inductive loop includes a first core; a second inductive loop configured to carry a second current that produces a second magnetic field, wherein the second inductive loop includes a second core; a third inductive loop configured to carry a third current that produces a third magnetic field; a first resistor connected to a first side of the first core and a first side of the second core; and a second resistor connected to a second side of the first core and a second side of the second core; wherein the first magnetic field and the second magnetic field suppress an effect of the third magnetic field on the first current and the second current; and wherein the first magnetic field and the second magnetic field oppose each other to suppress the effect on the third current in the third inductive loop.

EXAMPLE EMBODIMENTS

A coupled inductor structure is provided in the present disclosure that reduces electromagnetic (EM) interference between on-chip inductors (e.g., as may be used in LC-Voltage Controlled Oscillators) so that the oscillators containing the inductors are less sensitive to interference from the surrounding environment, and less likely to produce interference in the surrounding environment, thus allowing for closer placement and/or operation at higher frequencies, of the on-chip inductors.

Figure 1A:
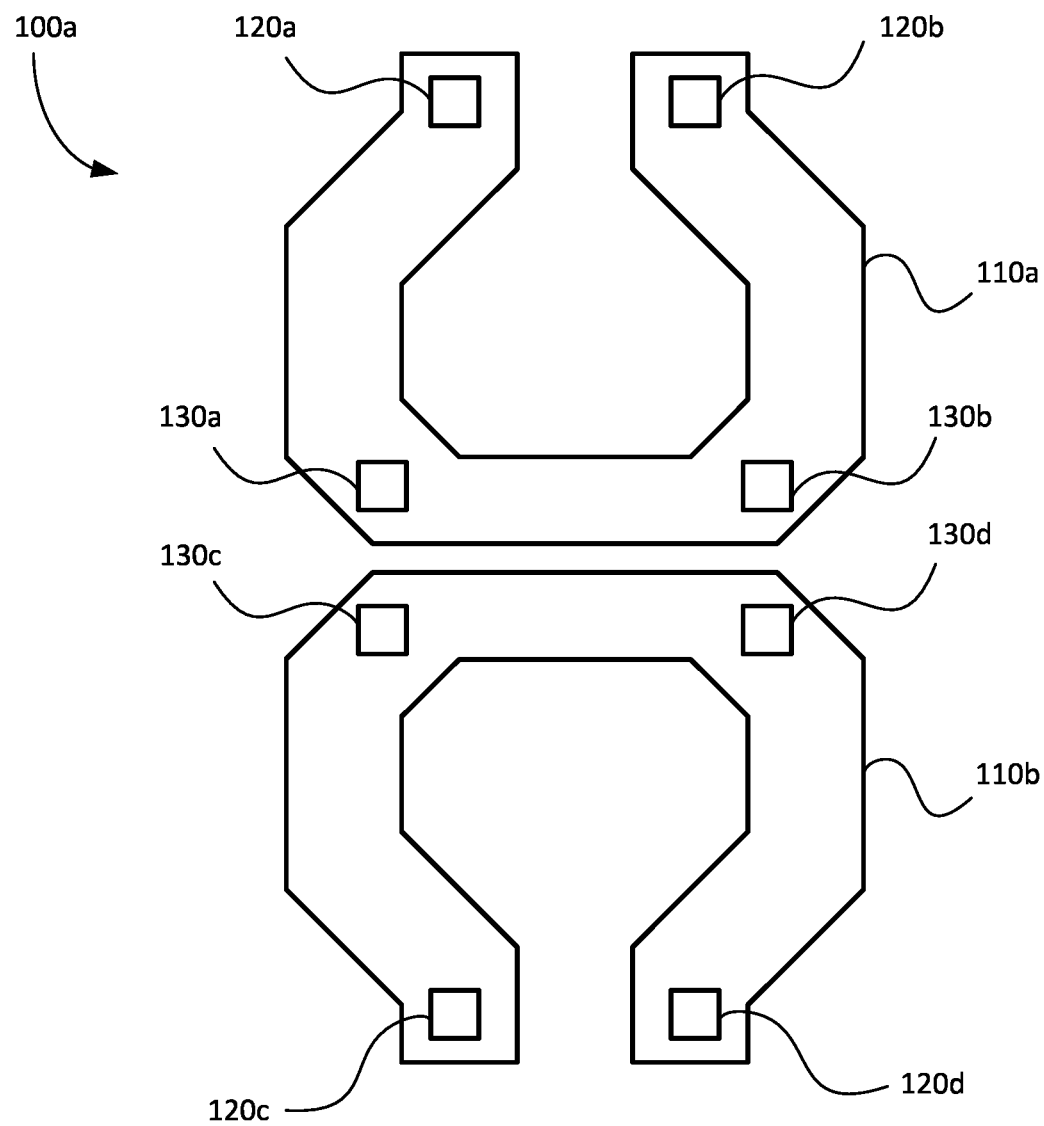
FIGS. 1A and 1B illustrate port placements for various inductor structures, according to embodiments of the present disclosure.
Figure 1B:
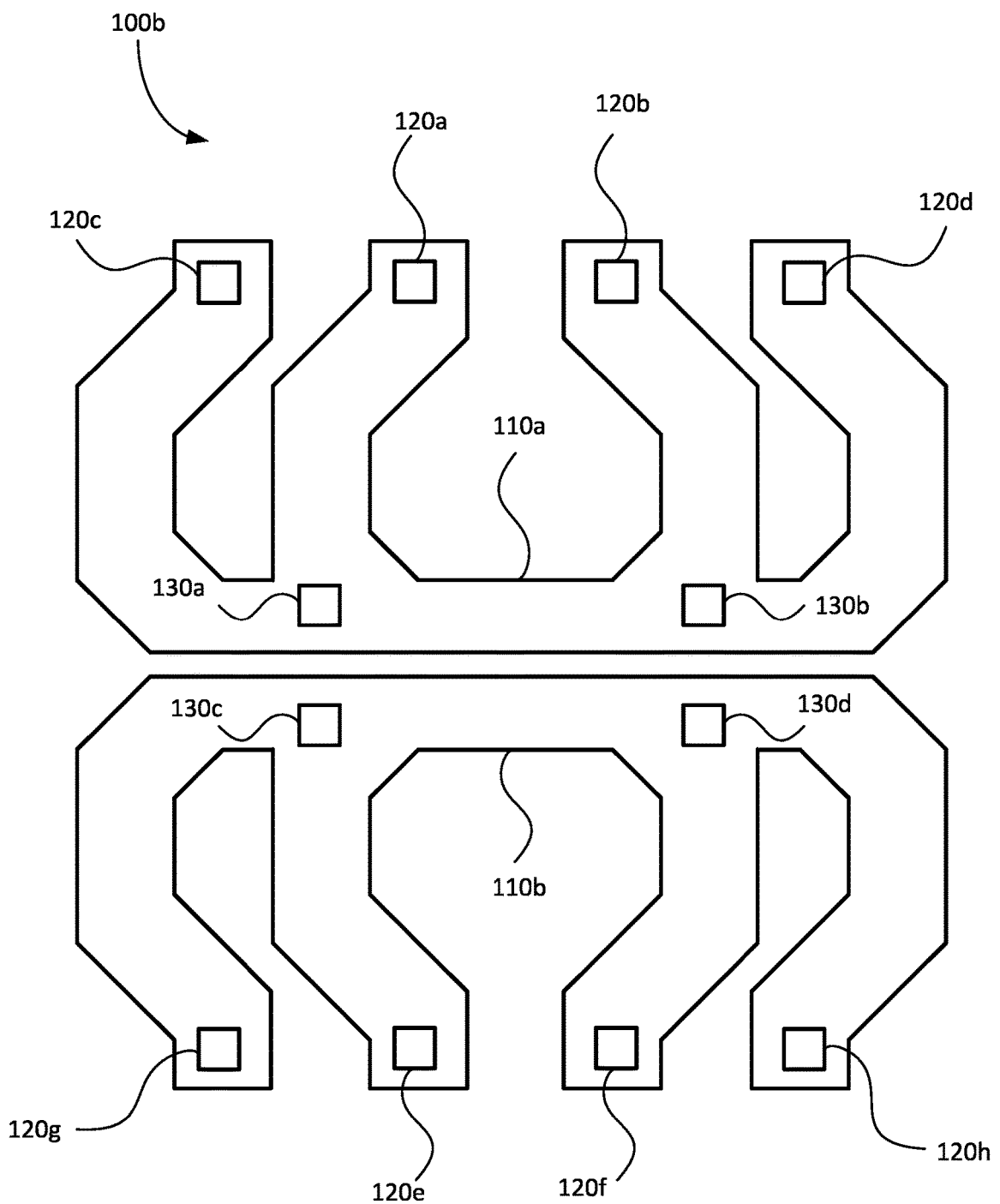

FIGS. 1A and 1B illustrate port placements for various inductor structures 100a-b (generally or collectively, inductor structure 100), according to embodiments of the present disclosure. As will be appreciated, although shown with various numbers of ports in the examples given in the present disclosure, the teachings provided herein are generally applicable by one of skill in the art to include structures with different numbers of ports so that an example given with 8-ports can be applied to an example with 12-ports and vice versa. Additionally, various elements may be referred to as a "first" or a "second" instance of an element, but the various elements can be designated according to different schemes in different embodiments.

FIG. 1A illustrates port placement for an 8-port inductor structure 100a, according to embodiments of the present disclosure. The 8-port inductor structure 100a includes a first inductive loop 110a (generally or collectively, inductive loop 110) paired with a second inductive loop 110b so that the first inductive loop 110a and second inductive loop 110b can electromagnetically couple with one another when respective currents are applied through the inductive loops 110.

As shown in FIG. 1A, the first inductive loop 110a includes a first signal port 120a (generally or collectively, signal port 120), a second signal port 120b, a first resistor port 130a (generally or collectively, resistor port 130), and a second resistor port 130b. Similarly, the second inductive loop 110b includes a third signal port 120c, a fourth signal port 120d, a third resistor port 130c, and a fourth resistor port 130d. Each signal port 120 is linked to one of the resistors ports 130, and the two resistor ports 130 are linked to one another to form the respective inductive loop 110. The signal ports 120 are configured to receive or output a signal carried as a current through the associated inductive loop 110 to another signal port in the inductive loop 110, which produces a magnetic field that electromagnetically couples the two inductive loops 110 and suppresses interference due to the design of the inductor structure 100 as is discussed in greater detail in relation to the electrical diagrams of FIG. 2.

FIG. 1B illustrates port placement for a 12-port inductor structure 100b, according to embodiments of the present disclosure. The 12-port structure has common mode and differential mode resonances that improve the phase noise performance in the oscillators. The 12-port inductor structure 100b includes a first inductive loop 110a paired with a second inductive loop 110b so that the first inductive loop 110a and second inductive loop 110b can electromagnetically couple with one another when respective currents are applied through the inductive loops 110.

As shown in FIG. 1B, the first inductive loop 110a includes a first signal port 120a, a second signal port 120b, a third signal port 120c, a fourth signal port 120d, a first resistor port 130a, and a second resistor port 130b. Similarly, the second inductive loop 110b includes a fifth signal port 120e, a sixth signal port 120f, a seventh signal port 120g, an eighth signal port 120h, a third resistor port 130c, and a fourth resistor port 130d. Each signal port 120 is linked to one of the resistors ports 130, and the two resistor ports 130 are linked to one another to form the respective inductive loop 110. The signal ports 120 are configured to receive or output a signal carried as a current through the associated inductive loop 110 to another signal port in the inductive loop 110, which produces a magnetic field to electromagnetically couple the two inductive loops 110 and suppresses interference due to the design of the inductor structure 100 as is discussed in greater detail in relation to the electrical diagrams of FIG. 2.

Due to the increased number of legs between the signal ports 120 and the resistor ports 130 offered by the 12-port inductor structure 100b in FIG. 1B compared to the 8-port inductor structure 100a in FIG. 1A, various signal pathways can be defined between different signal ports 120. For example, both of the inductor structures 100a-b can define a signal pathway running from the first signal port 120a, through the first resistor port 130a and the second resistor port 130b, to the second signal port 120b (and the reverse). However, the 12-port inductor structure can also define signal pathways running from the first signal port 120a or the third signal port 120c, through the first resistor port 130a and the second resistor port 130b, to the second signal port 120b or the fourth signal port 120d. In various embodiments, some or all of the potential legs can be active at a given time (e.g., the 12-port inductor structure 100b can send/receive signals via the first and second signal ports 120a-b, the third and fourth signal ports 120c-d, the first through fourth signal ports 120a-d, etc.).

Figure 2:
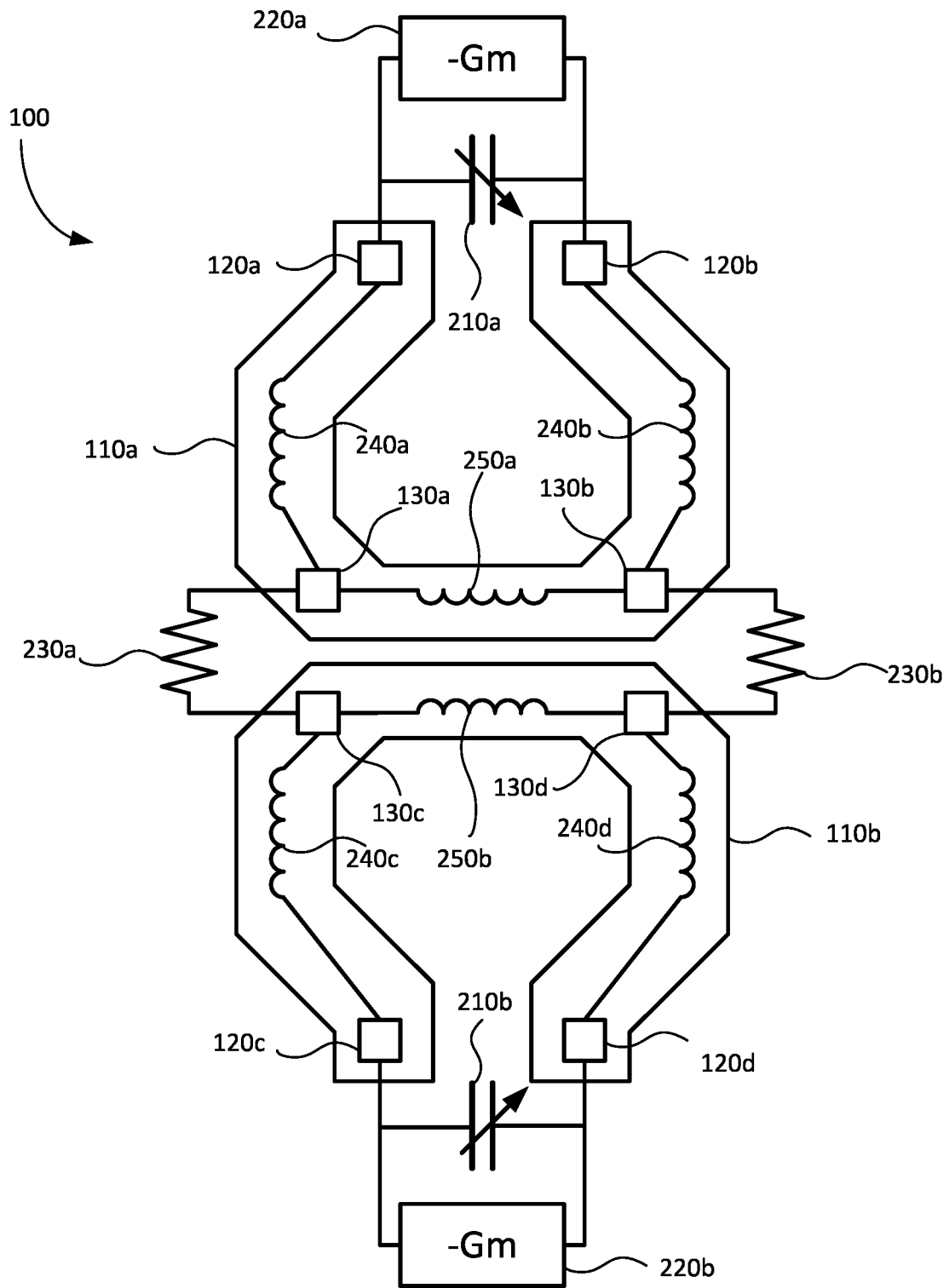
FIG. 2 illustrates an electrical component layout for an inductor structure, according to embodiments of the present disclosure.

FIG. 2 illustrates an electrical component layout for an inductor structure 100, according to embodiments of the present disclosure. Although shown in relation to an 8-port inductor structure 100a (as shown in FIG. 1A), the electrical components discussed herein can be applied to various other inductor structures 100 with more than eight ports. Accordingly, FIG. 2 shows the "connected" legs of an inductor structure 100 with at least four signal ports 120 and omits illustration of any "unconnected" legs thereof.

A first capacitor 210a (generally or collectively capacitor 210) with an adjustable capacitance is connected across the first signal port 120a and the second signal port 120b of the first inductive loop 110a, and a second capacitor 210b with an adjustable capacitance is connected across the third signal port 120c and the fourth signal port 120d of the second inductive loop 110b. In various embodiments, the capacitors 210 have an adjustable capacitance, although fixed-capacitance capacitors 210 or other capacitive elements with adjustable capacitances can also be used.

A first negative transconductance 220a (generally or collectively, transconductance 220) of $-G_m$ is also connected across the first signal port 120a and the second signal port 120b of the first inductive loop 110a, and a second negative transconductance 220b of $-G_m$ is connected across the third signal port 120c and the fourth signal port 120d of the second inductive loop 110b.

In inductor structures 100 with more than eight ports, the capacitors 210 and transconductances 220 can be connected across different signal port pairs for each inductive loop 110. For example, with reference to the 12-port inductor structure 100b of FIG. 1B, the capacitor 210 and transconductance 220 could be connected between the third signal port 120c and the second signal port 120b, the first signal port 120a and the fourth signal port 120d, etc.

Each inductive loop 110 of the inductor structure 100 can be understood as an inductor with several divisions defined between the various ports, where "legs" of the inductive loops 110 are defined between one signal port 120 and one resistor port 130, and the "cores" of the inductive loops 110 are defined between two resistors ports 130. Each of these divisions of the inductive loops 110 can, in turn, be understood as discrete elements or as parts of a monolithic inductive loop 110.

The "legs" of the inductive loops 110 each include a corresponding leg inductor 240a-d (generally or collectively, leg inductor 240) located between a signal port 120 and a resistor port 130. For example, a first leg inductor 240a having a first leg inductance ($L_{leg}$) is located between the first signal port 120a and the first resistor port 130a, and a fourth leg inductor 240d having a fourth leg inductance ($L_{leg}$) is located between the fourth signal port 120d and the fourth resistor port 130d. In various embodiments, each of the leg inductances ($L_{leg}$) are set to the same nominal value as one another. In other embodiments, the leg inductances ($L_{leg}$) between different potentially connected legs are set to different values (e.g., the legs connected to the fifth and sixth signal ports 120e-f in FIG. 1B are set to a first leg inductance $L_{leg-1}$ and the legs connected to the seventh and eighth signal ports 120g-h are set to a second, different leg inductance $L_{leg-2}$) to allow for multi-core VCOs with several different inductance values to select from.

The "cores" of the inductive loops 110 each include a corresponding core inductor 250a-b (generally or collectively, core inductor 250) located between the resistor ports 130. The core inductors 250 are aligned, but physically separated from one another. The first inductive loop 110a includes a first core inductor 250a located between the first resistor port 130a and the second resistor port 130b, while the second inductive loop 110b includes a second core inductor 250b located between the third resistor port 130c and the fourth resistor port 130d. Each of the core inductors 250 is set to the same nominal core inductance ($L_{core}$), which may be the same as, greater than, or less than the leg inductance ($L_{leg}$) of the leg inductors 240 in various embodiments.

A first resistor 230a (generally or collectively, resistor 230) is connected between the first resistor port 130a and the third resistor port 130c, and a second resistor 230b is connected between the second resistor port 130b and the fourth resistor port 130d. The mitigating resistance ($R_m$) of the resistors 230 is chosen to suppress the impedance ($R_{p-ODD}$) of the inductor structure 100 in the odd-mode to be smaller than the impedance ($R_{p-EVEN}$) when in the even-mode. Accordingly, to provide improved interference suppression, $G_m$ for the transconductances 220 is selected such that $G_m R_{p-ODD} < 1$ when the inductor structure 100 operates in odd-mode.

The mitigating resistance ($R_m$) for each of the resistors 230 is set to the same nominal value. In various embodiments, the resistors 230 are variable resistors (e.g., varistors) that have adjustable resistance values for the mitigating resistance ($R_m$) to allow for process variations in the chip containing the inductor structure 100 (tuning against the inductances of the various inductors). In some embodiments, the mitigating resistance ($R_m$) is set to the center of an optimum range for mitigating the nominal odd-mode impedance of the inductor structure 100 to allow for process variations in the actual inductances and resistances for a fabricated chip that includes the inductor structure 100. The inductances across the (connected) legs and the core are substantially symmetrical across the inductive loops 110a-b.

Figure 3A:
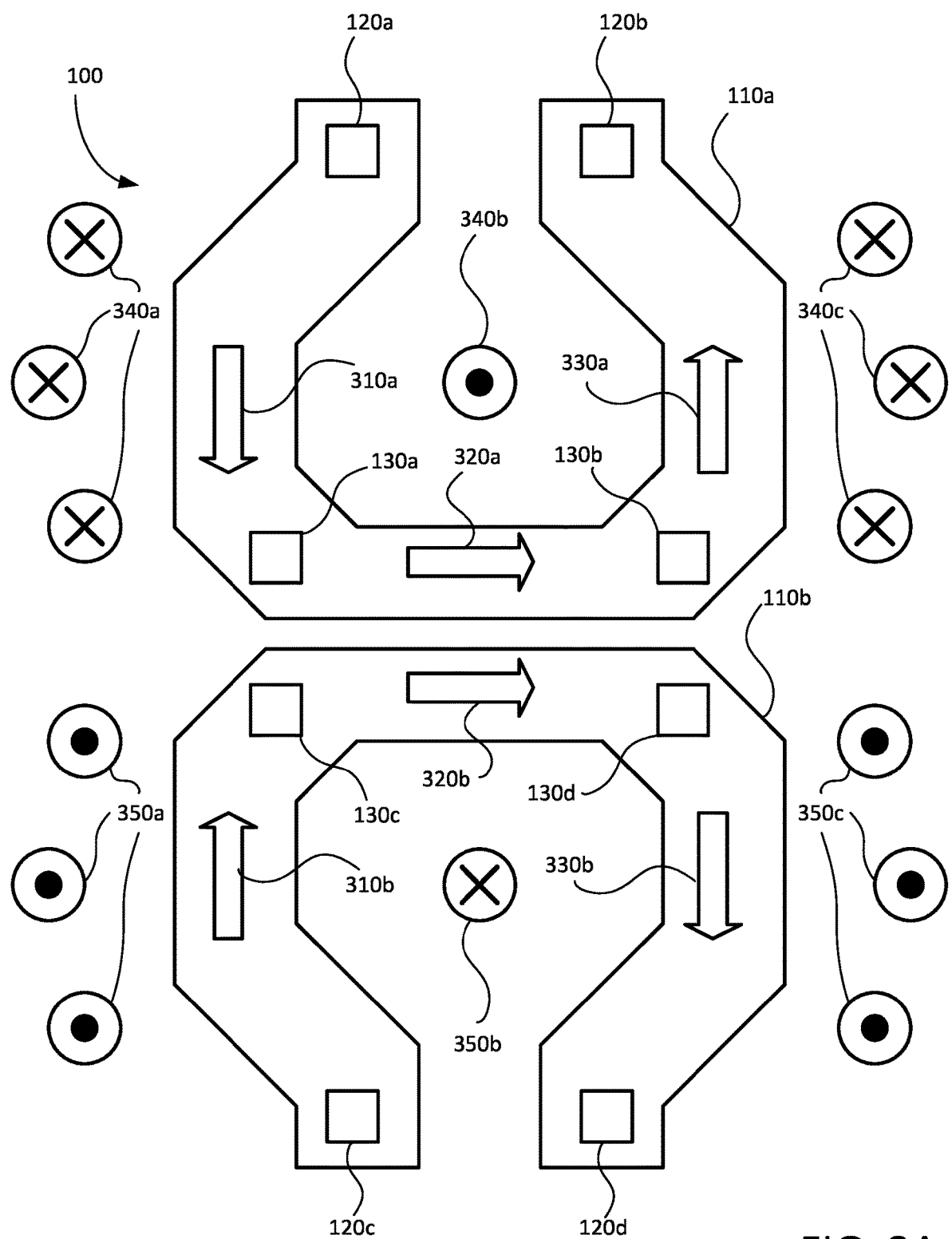
FIGS. 3A and 3B illustrate magnetic field diagrams for an inductor structure, according to embodiments of the present disclosure.
Figure 3B:
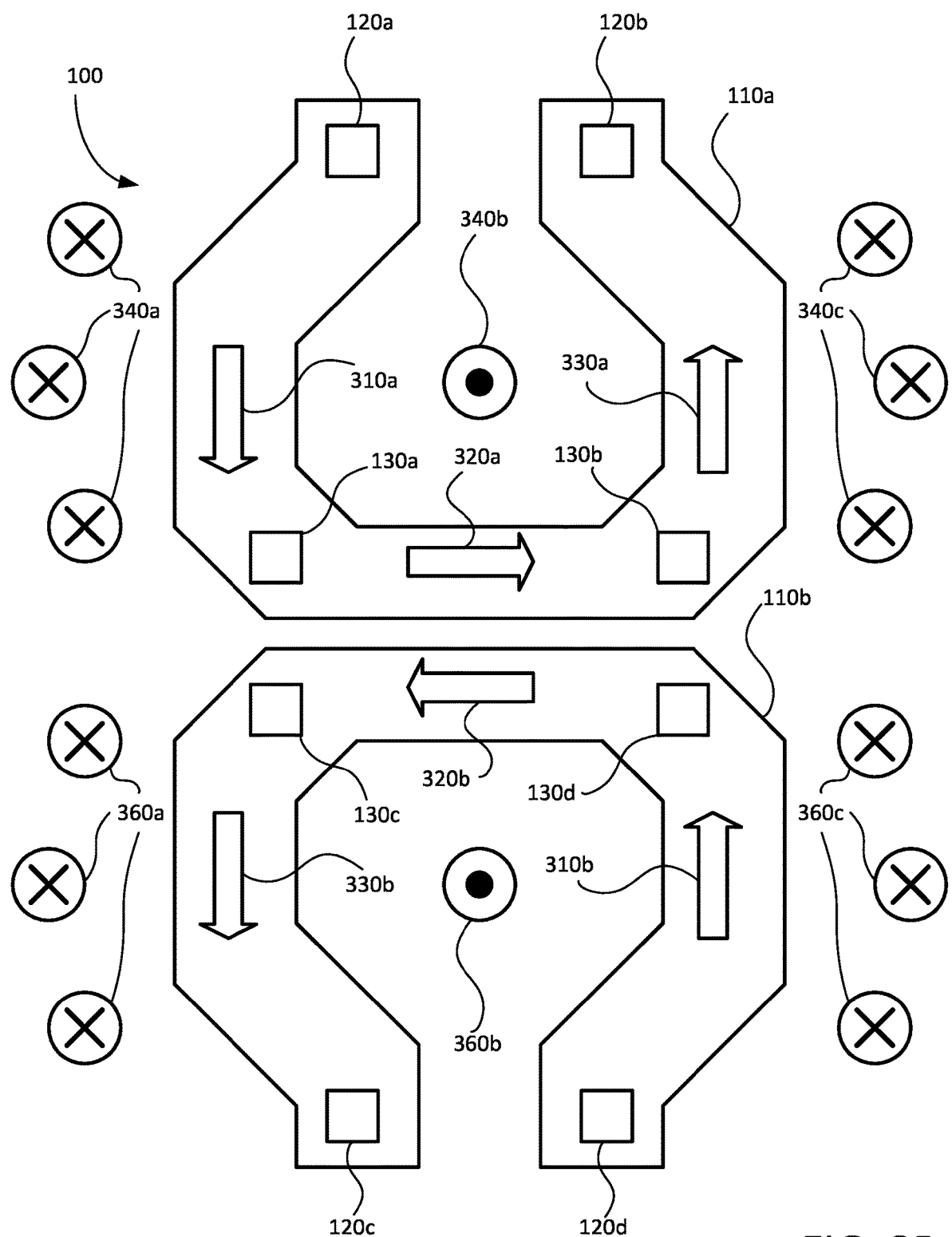

The resistors 230 couple the inductive loops 110 to force current flow to the directions used in even-mode conductance rather than odd-mode conductance (as discussed in greater detail in regards to FIGS. 3A-3B). This coupling between the inductive loops 110 forms a higher-order system, which suppresses unwanted magnetic field interferences (e.g., from external interference sources, surrounding inductors) in the inductor structure 100 and also reduces interference generated by 100 to the surrounding environment on the chip.

FIGS. 3A and 3B illustrate magnetic field diagrams for an inductor structure 100, according to embodiments of the present disclosure. Although shown in relation to an 8-port inductor structure 100a (as shown in FIG. 1A), the magnetic fields discussed herein can be applied to various other inductor structures 100 with more than eight ports. Accordingly, FIGS. 3A and 3B show the "connected" legs of an inductor structure 100 and omits illustration of any "unconnected" legs thereof.

FIG. 3A illustrates even-mode operation of the inductor structure 100, where currents in each of the inductive loops 110 form opposing magnetic fields, while FIG. 3B illustrates odd-mode operation of the inductor structure 100, where currents in each of the inductive loops 110 form aiding magnetic fields.

As shown in both FIGS. 3A and 3B, a first input current 310a is received at the first signal port 120a that is carried to the first resistor port 130a, a first core current 320a is carried between the first and second resistor ports 130a-b, and a first output current 330a is carried from the second resistor port 130b to the second signal port 120b. These currents 310a, 320a, 330a in the first inductive loop 110a produce a first magnetic field, shown with first field lines 340a-c. The external first field lines 340a, 340c project into the page (away from the reader), while the internal first field line 340b projects out of the page (towards the reader).

In FIG. 3A the second inductive loop 110b produces an opposing magnetic field to that produced by the first inductive loop 110a. The opposing magnetic field is generated by a second input current 310b received at the third signal port 120c that is carried to the third resistor port 130c, a second core current 320b carried between the third and fourth resistor ports 130c-d, and a second output current 330b carried from the fourth resistor port 130d to the fourth signal port 120d. These currents 310b, 320b, 330b in the second inductive loop 110b produce a second magnetic field, shown with opposing field lines 350a-c that oppose the first field lines 340a-c produced by the first magnetic field from the first inductive loop 110a; canceling out the magnetic fields outside of the inductive structure 100. The first and second core currents 320a-b are in the same direction, and the mutual inductance (M) thereof is positive. Accordingly, the inductance of the inductive structure 100 when operating in the even-mode can be given by Formula 1 as:

$$L_{even} = 2L_{leg} + L_{core} + M \qquad (1)$$

In FIG. 3B the second inductive loop 110b produces a complementary magnetic field to that produced by the first inductive loop 110a. The complementary magnetic field is generated by a second input current 310b received at the fourth signal port 120d that is carried to the fourth resistor port 130d, a second core current 320b carried between the fourth and third resistor ports 130d-c, and a second output current 330b carried from the third resistor port 130c to the third signal port 120c. These currents 310b, 320b, 330b in the second inductive loop 110b produce a second magnetic field, shown with complementary field lines 360a-c that complement the first field lines 340a-c produced by the first magnetic field from the first inductive loop 110a. The first and second core currents 320a-b are in opposite directions, and the mutual inductance (M) thereof is negative. The mutual inductance (M) is based on the coupling factor (k) between the first and second inductive loops 110a-b and the inductance of the core inductors 250 ($L_{core}$) and can be given by Formula 2 as:

$$M = kL_{core} \qquad (2)$$

Accordingly, the inductance of the inductive structure 100 when operating in the odd-mode can be given by Formula 3 as:

$$L_{odd} = 2L_{leg} + L_{core} - M \qquad (3)$$

The resistors 230 in the inductor-capacitor structure of FIG. 2 suppress the oscillations in the odd-mode by reducing the odd-mode impedance RP-ODD relative to the even-mode impedance RP-EVEN and thereby increasing the resistive losses in signal strength when operating (or induced to operate by an interference source) in the odd-mode. Because the inductive loops 110 are nominally symmetrical (both physically and in impedances), the voltages seen at each resistor port 130 when operating in the even-mode are substantially equal leading to zero voltage across the resistors 230, resulting in no current flow over the resistor 230, and thus no additional resistive losses in signal strength.

For example, when operating in even-mode, the first input current 310a and the second input current 310b experience similar losses over the corresponding first leg inductor 240a and third leg inductor 240c, thus providing similar voltages at the first resistor port 130a and the third resistor port 130c. Because both sides of the first resistor 230a (connected across the first resistor port 130a and third resistor port 130c) see the same voltage level, no current is expected to be carried between the first resistor port 130a and third resistor port 130c. Similarly, the second resistor 230b also sees the same voltage level on either side, and no current is expected to be carried between the second resistor port 130b and the fourth resistor port 130d.

In contrast, when operating in odd-mode, the first resistor port 130a and the third resistor port 130c (and the second resistor port 130b and the fourth resistor port 130d) see same voltage levels but with opposite signs due to the opposite direction of the current flow through 110a and 110b. Accordingly, different sides of the first resistor 230a and the second resistor 230b see the opposite voltage levels, and current flows through the resistors 230, and experiences resistive losses; suppressing the odd-mode impedance and oscillations.

Figure 4:
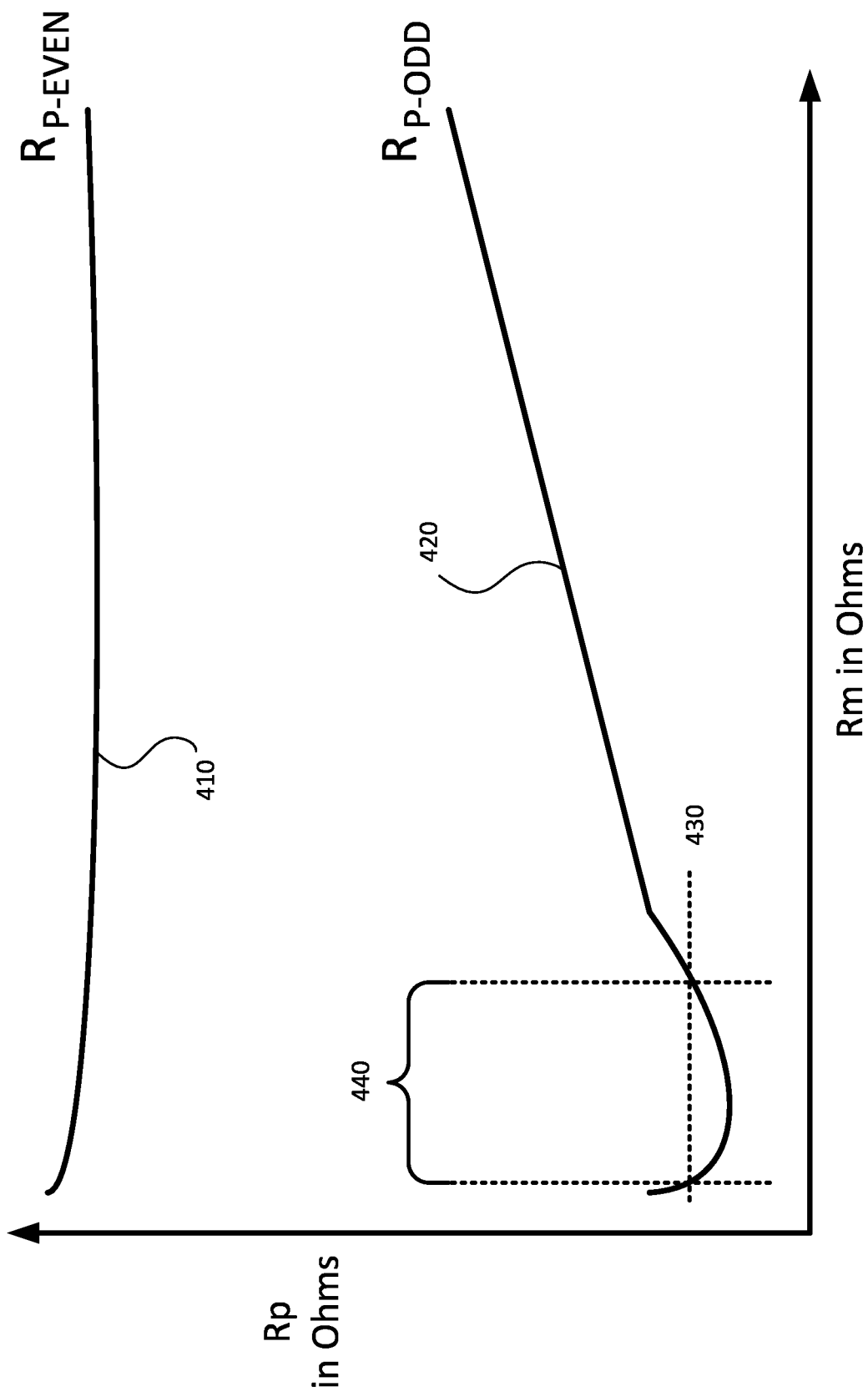
FIG. 4 illustrates ranges for the parallel/shunt impedance in even and odd modes of the inductor structure across different values of mitigating resistance, according to embodiments of the present disclosure.

FIG. 4 illustrates ranges for the equivalent parallel impedance ($R_p$) of the inductor structure 100 across different values of mitigating resistance ($R_m$), according to embodiments of the present disclosure. Because the even-mode provides for cancelling the magnetic fields generated by the inductor structure 100, while the odd-mode does not, operation in the even-mode provides for suppressing external electromagnetic interference, but the odd-mode does not. Therefore, to ensure that the inductor structure 100 resonates in the even-mode at a given resonant frequency and does not resonate (or resonates less) in the odd-mode at that frequency, the resistors 230 are included between the resistor ports 130. The resistance ($R_m$) selected for the resistors 230, however, affects how much the impedance ($R_p$) of the inductor structure 100 is suppressed in the odd-mode relative to the even-mode, and the value for the mitigating resistance ($R_m$) is therefore based on the inductances and coupling factor of the operation inductor structure 100.

As shown, because the resistors 230 have minimal effect on the impedance (RP-EVEN) of the inductor structure 100 during even-mode operation, the even-mode impedance curve 410 illustrates that the impedance (RP-EVEN) remains relatively constant across various values for the mitigating resistance ($R_m$).

In contrast, the odd-mode impedance curve 420 shows greater relative variability over various values for the mitigating resistance ($R_m$). In various embodiments, a ratio threshold 430 is selected to define a ratio between the even-mode impedance curve 410 and the odd-mode impedance curve 420 (e.g., between a ratio of 2:1 and 3:1). The values for the mitigating resistance ($R_m$) that correspond to the points on the even-mode impedance curve 410 and the odd-mode impedance curve 420 that satisfy the ratio threshold define a range 440 of resistance values for use in the resistors 230 as the mitigating resistance ($R_m$). For example, the curves 410 and 420 may display a ratio that satisfies the ratio threshold 430 when the mitigating resistance ($R_m$) is between X Ohms and Y Ohms, and the resistors 230 are therefore set to a value between X Ohms and Y Ohms (e.g., the mean or midpoint between X and Y). Accordingly, an operator can select a mitigating resistance ($R_m$) from the range 440 that satisfies the ratio threshold 430 to suppress odd-mode current flow through the core inductors 250 at a resonate frequency for even-mode current flow through the core inductors 250.

Figure 5A:
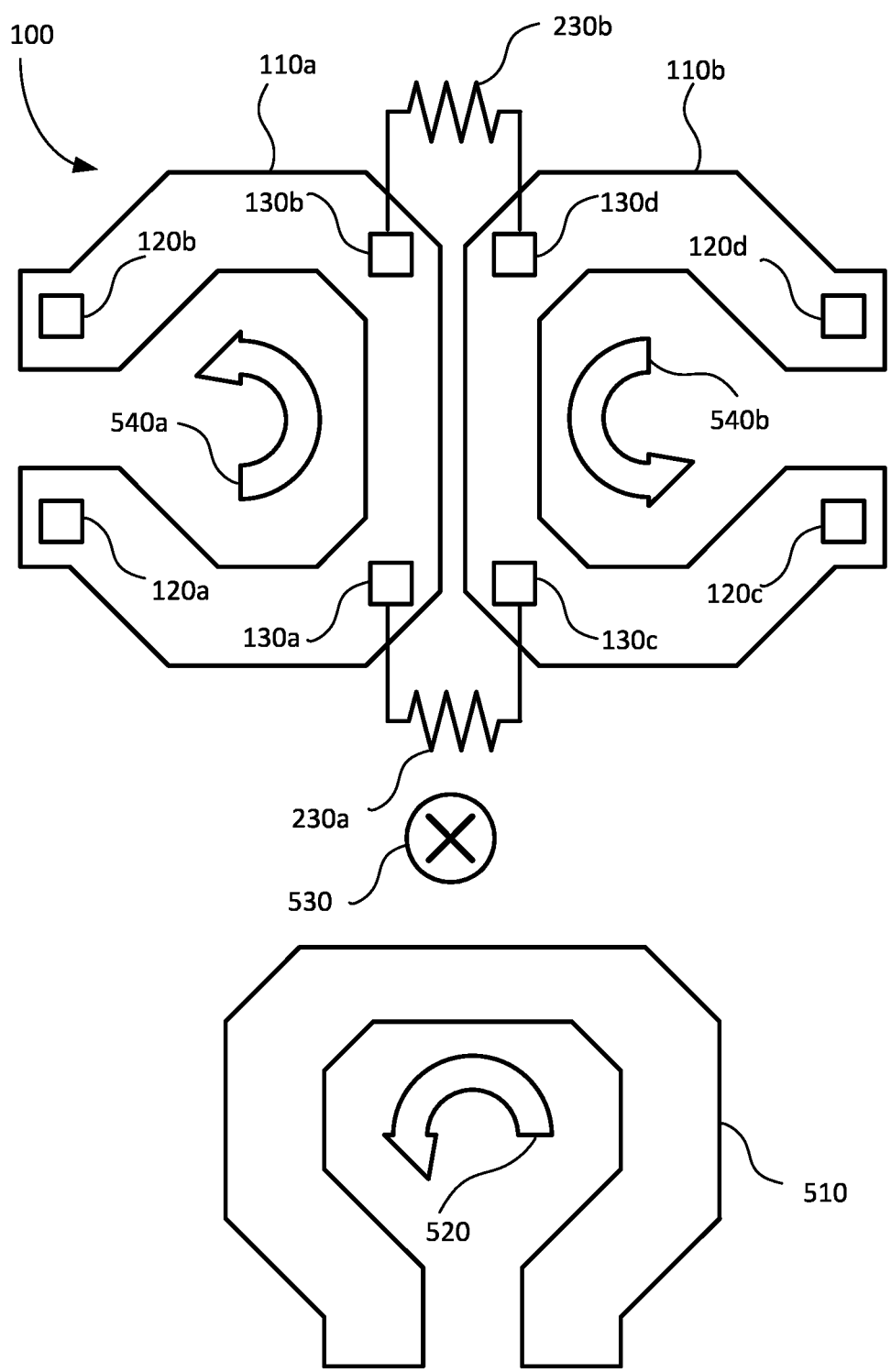
FIGS. 5A-5B illustrates a layout of a device including two inductive loops configured to mitigate external electromagnetic interference, according to embodiments of the present disclosure.
Figure 5B:
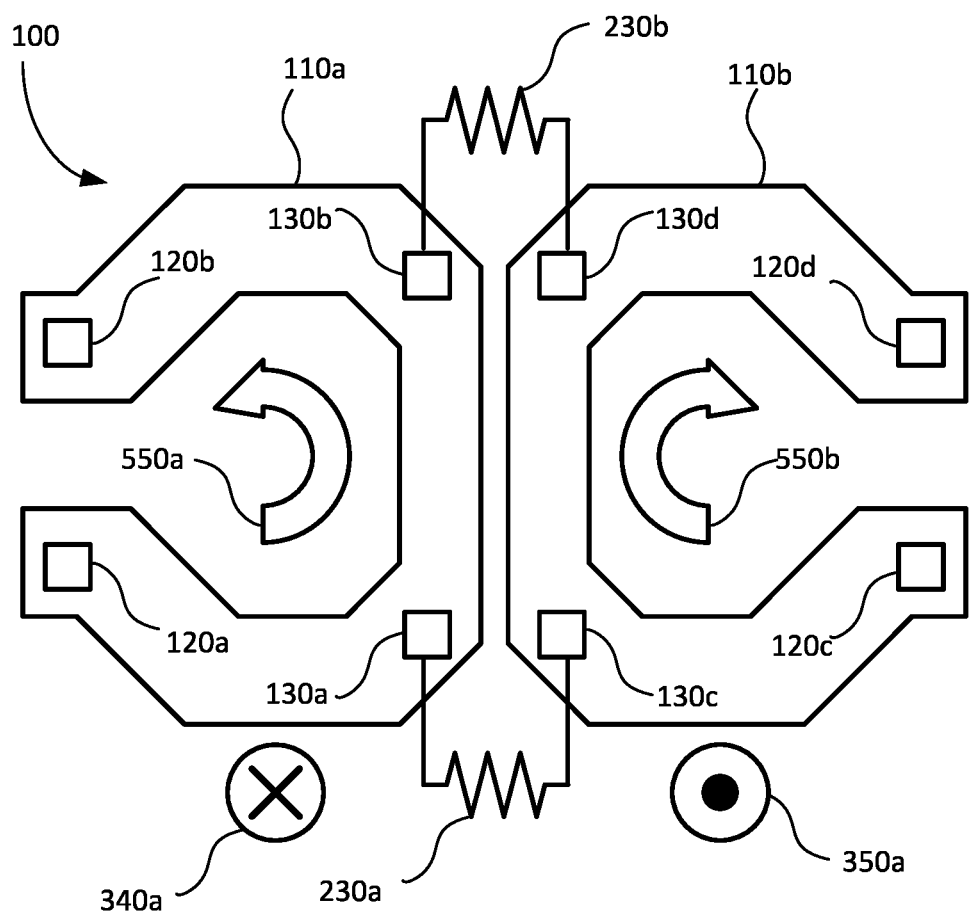
Figure 5B:
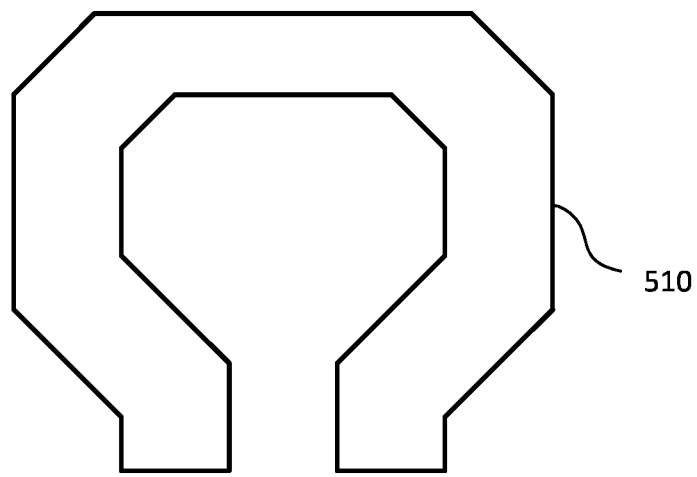

FIGS. 5A-5B illustrate a layout of a device including two inductive loops 110a-b configured to mitigate external electromagnetic interference (e.g., from an interfering inductive loop 510), according to embodiments of the present disclosure. Although shown in relation to an 8-port inductor structure 100a (as shown in FIG. 1A), the magnetic fields discussed herein can be applied to various other inductor structures 100 with more than eight ports. Accordingly, FIGS. 5A-5B show the "connected" legs of an inductor structure 100 and omits illustration of "unconnected" legs (if any) thereof.

FIG. 5A illustrates effect of an interfering inductive loop 510 acting as an aggressor on the inductor structure 100. An interfering current 520 carried in the interfering inductive loop 510 generated an interfering magnetic field 530 that induces a first induced current 540a (generally or collectively, induced current 540) in the first inductive loop 110a and a second induced current 540b in the second inductive loop 110b. The induced currents 540 flow in the same directions as the currents seen when the inductive structure 100 operates in the odd-mode (as described in greater detail in regard to FIG. 3B). Accordingly, the resistors 230a-b linking the two inductive loops 110a-b via the respective resistor ports 130a-d help dissipate the effect of the interfering magnetic field 530 on the inductor structure 100.

FIG. 5B illustrates the inductor structure 100 operating in the even-mode (as described in greater detail in regard to FIG. 3A) to mitigate the interference generated by the inductor structure on another inductive loop 510. When a first current 550a is passed through the first inductive loop 110a and a second current 550b is passed through the second inductive loop 110b in an even-mode (e.g., from the first signal port 120a to the second signal port 120b and from the third signal port 120c to the fourth signal port 120d), the inductor structure 100 produces a first magnetic field line 340a and first opposing magnetic field line 350a that cancel one another. Accordingly, no interfering magnetic field (530) is generated, and no interfering current (520) is generated in the other inductive loop 510.

Although illustrated in FIGS. 5A and 5B with the other inductive loop 510 located to one side of the legs of the inductor structure 100, at a 90 degree angle to the inductive loops 110 of the inductor structure 100, and aligned with the center of the inductor structure 100, the inductor structure described herein offers isolation in various alignments beyond those shown in the present examples.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

As described herein, several physical or electrical components may be described as being set to or otherwise having the same value. As will be understood, various values for components are set within tolerance ranges (e.g., X±Y or from A to Z), and two or more elements exhibiting values within a specified tolerance range of one another shall be understood to share substantially similar values even if the values are not exactly the same. For example, two resistors set to a nominal value of 50 Ohms but displaying values of 49 Ohms and 51 Ohms shall be considered to have the same or substantially similar values when the tolerance is at least ±1 Ohm.

In view of the foregoing, the scope of the present disclosure is determined by the claims that follow.

We claim:

1. A device, comprising:
   a first signal port connected to a first resistor port via a first inductor;
   a second resistor port connected to the first resistor port via a second inductor;
   a second signal port connected to the second resistor port via a third inductor;
   a third resistor port connected to the first resistor port via a first resistor;
   a fourth resistor port connected to the third resistor port via a fourth inductor and to the second resistor port via a second resistor;
   a third signal port connected to the third resistor port via a fifth inductor; and
   a fourth signal port connected to the fourth resistor port via a sixth inductor, wherein the first inductor, the third inductor, the fifth inductor, and the sixth inductor are each configured with a first given inductance less than a second given inductance, and wherein the second inductor and the fourth inductor are configured with the second given inductance.

2. The device of claim 1, further comprising:
   a fifth signal port connected via a seventh inductor to the first resistor port;
   a sixth signal port connected via an eighth inductor to the second resistor port;
   an seventh signal port connected via a ninth inductor to the third resistor port; and
   an eighth signal port connected via a tenth inductor to the fourth resistor port.

3. The device of claim 2, wherein the seventh inductor, eighth inductor, ninth inductor, and tenth inductor are each configured with a third inductance and the first inductance is less than the third inductance.

4. The device of claim 1, wherein the first resistor and the second resistor are configured with a mitigating resistance selected to suppress odd-mode current flow through the second inductor and the fourth inductor at a resonate frequency for even-mode current flow through the second inductor and the fourth inductor.

5. The device of claim 4, wherein the mitigating resistance is selected in a range that satisfies a ratio threshold for an even-mode impedance relative to an odd-mode impedance.

6. The device of claim 1, wherein the first inductor is a first core inductor, the second inductor is a first leg inductor, and the third inductor is a second leg inductor that define a first inductive loop and the fourth inductor is a second core inductor, the fifth inductor is a third leg inductor, and the sixth inductor is a fourth leg inductor that define a second inductive loop.

7. The device of claim 1, wherein the second inductor and the fourth inductor are configured to be magnetically coupled when a first current passes through the second inductor and a second current passes through the fourth inductor.

8. The device of claim 1, further comprising:
   a first adjustable capacitor connected between the first signal port and the second signal port; and
   a second adjustable capacitor connected between the third signal port and the fourth signal port.

9. A device, comprising:
   a first inductive loop connected to a second inductive loop by a first resistor and a second resistor, wherein the first inductive loop and the second inductive loop are physically separated from each other, and wherein each of the first inductive loop and the second inductive loop comprise:
   a first signal port connected to the first resistor via a first inductor;
   a second signal port connected to the second resistor via a second inductor; and
   a third inductor connected on a first side to the first inductor and the first resistor and connected on a second side to the second inductor and the second resistor, wherein the third inductor of the first inductive loop is configured to be magnetically coupled with the third inductor of the second inductive loop when respective currents pass through the first inductive loop and the second inductive loop.

10. The device of claim 9, wherein each of the first inductive loop and the second inductive loop further include:
    a third signal port connected to the first resistor and the third inductor via a fourth inductor; and
    a fourth signal port connected to the second resistor and the third inductor via a fifth inductor.

11. The device of claim 9, wherein the first inductor and the second inductor share a first inductance value different from a second inductance value of the third inductor.

12. The device of claim 9, wherein the first inductor, the second inductor, and the third inductor share an inductance value.

13. The device of claim 9, wherein each of the first inductive loop and the second inductive loop further include:
    an adjustable capacitance capacitor connected to the first signal port and the second signal port.

14. A device, comprising:
    a first inductive loop configured to carry a first current that produces a first magnetic field, wherein the first inductive loop includes a first core;
    a second inductive loop configured to carry a second current that produces a second magnetic field, wherein the second inductive loop includes a second core;
    a third inductive loop configured to carry a third current that produces a third magnetic field;
    a first resistor connected to a first side of the first core and a first side of the second core; and
    a second resistor connected to a second side of the first core and a second side of the second core;
    wherein the first magnetic field and the second magnetic field suppress an effect of the third magnetic field on the first current and the second current; and
    wherein the first magnetic field and the second magnetic field oppose each other to suppress the effect on the third current in the third inductive loop.

15. The device of claim 14, wherein the first inductive loop and the second inductive loop each include at least two signal ports, a first resistor port, and a second resistor port, wherein the first resistor is connected to the first resistor port of the first inductive loop and the second inductive loop and the second resistor is connected to the first inductive loop and the second inductive loop.

16. The device of claim 15, wherein leg inductors are connected between each of the at least two signal ports and one of the first resistor port and the second resistor port.

17. The device of claim 16, wherein leg inductors each have a lower inductance than a core inductor.

* * * * *